United States Patent [19]
Hatada

[11] Patent Number: 5,202,908
[45] Date of Patent: Apr. 13, 1993

[54] SHIFT REGISTER
[75] Inventor: Akiyoshi Hatada, Itami, Japan
[73] Assignee: Mitsubishi Denki Kabushiki Kaisha, Tokyo, Japan
[21] Appl. No.: 797,214
[22] Filed: Nov. 25, 1991
[30] Foreign Application Priority Data
Dec. 10, 1990 [JP] Japan ................. 2-401133
[51] Int. Cl.$^5$ ............................ H03K 3/284
[52] U.S. Cl. ........................... 377/64; 377/68; 377/77; 377/79; 377/80
[58] Field of Search ............ 377/64, 68, 77, 79, 377/80

[56] References Cited
U.S. PATENT DOCUMENTS

| | | | |
|---|---|---|---|
| 4,843,254 | 6/1989 | Motegi et al. | 377/79 |
| 5,003,201 | 3/1991 | Bai | 377/79 |
| 5,008,905 | 4/1991 | Lee et al. | 377/77 |
| 5,015,875 | 5/1991 | Giles et al. | 307/272.2 |

Primary Examiner—William L. Sikes
Assistant Examiner—Scott A. Ouellette
Attorney, Agent, or Firm—Morrison Law Firm

[57] ABSTRACT

A shift register includes a plurality of alternating shifting and latching sections connected in cascade. The phases of clocks (CLK, CLKB) for driving transmission gates (10, 14) of the shifting sections advance in phase relative to the phases of clocks (CLK, CLKB1) for driving transmission gates (12, 16) of the latching sections. The ON-resistance of the transmission gates (10, 14) of the shifting sections is sufficiently larger than that of the transmission gates (12, 16) of the latching sections, so that even when both of the clocks CLK and CLKB are at H or L levels due to delay imparted by inverters included in a clock generator, data to be latched is always given priority over data to be shifted. Thus, the shift register is free of a race condition which otherwise would be caused by a phase difference between the driving clocks.

12 Claims, 3 Drawing Sheets

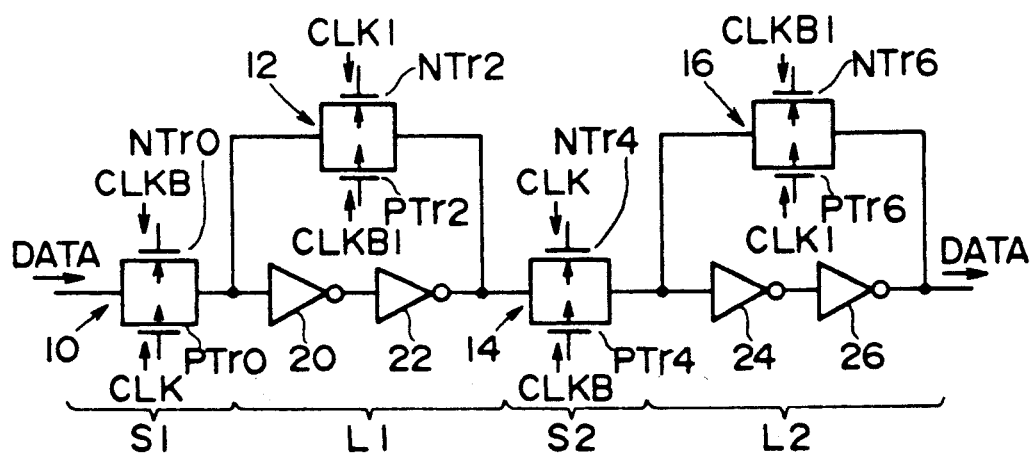
F I G. 7
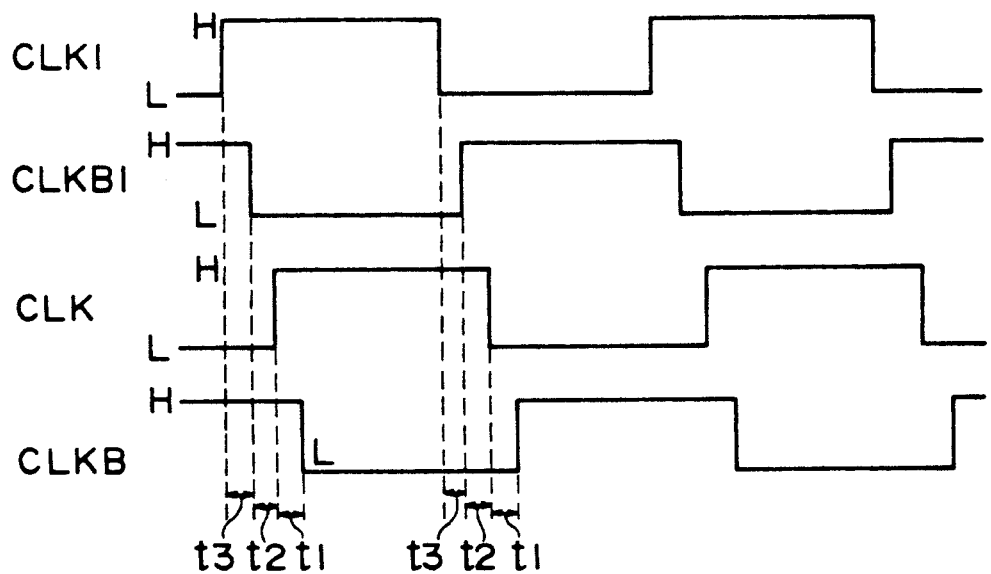
F I G. 8
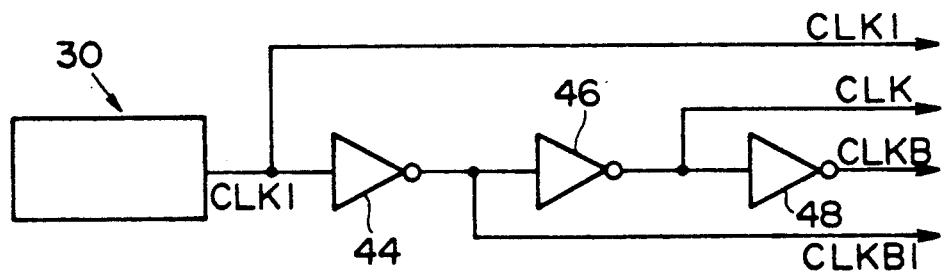
F I G. 9

SHIFT REGISTER

This invention relates to a shift register and more particularly to a shift register which includes a relatively small number of components so that it is suitably formed as an integrated circuit, and which can operate without causing a race condition and, therefore, with stability and precision.

BACKGROUND OF THE INVENTION

Various types of shift registers have been used. One of the most basic, conventional shift registers comprises a plurality of cascaded D flip-flops. A shift register of this type, however, disadvantageously occupies a substantially large area on a substrate when it is constructed in an integrated circuit form, because the number of components of each D flip-flop and the number of components of associated circuits are large.

In Japanese Published Patent Application No. SHO 63-76198, K. Akiyama discloses a shift register of the type which does not use any D flip-flops. The shift register of this type comprises a plurality of 1-bit memory cells adjacent ones of which are interconnected by two MOS transistors which are ON-OFF controlled by control signals. Each of the 1-bit memory cells comprises two inverters which are connected in a ring configuration with two MOS transistors disposed between the respective inputs and the respective outputs of the inverters. The two MOS transistors in the ring are ON-OFF controlled by control signals applied to the respective gate electrodes, which control signals are different from the control signals used to ON-OFF control the MOS transistors interconnecting adjacent memory cells. This type of shift register is more advantageous than shift registers using D flip-flops when they are formed as integrated circuits because the number of circuit components is smaller. According to the statement in this Japanese application, this shift register is free of a race condition. A "race condition" is an undesirable phenomenon in which, during a clock period for shifting one bit, plural bits of data are shifted through a shift register. However, in the shift register of Akiyama, due to time delays imparted by two inverters in the paths of the control signals, two of the control signals applied through two respective gates therefor, which should be in opposite phase with each other, would become in phase with each other for a short time period. This causes an undesirable race condition.

A second type of shift register that does not employ D flip-flops includes latching sections each comprising a series combination of two inverters and a CMOS transmission gate connected in parallel with the series combination of the two inverters, and shifting sections each comprising a CMOS transmission gate connecting two latching sections. In this second type of shift register, data is shifted therethrough by clocking the CMOS transmission gates of the latching and shifting sections, simultaneously. However, this simultaneous clocking could cause a race condition.

Accordingly, an object of the present invention is to provide a novel shift register which includes a relatively small number of circuit components and, hence, is suitable for constructing in an integrated circuit form, and which is free of a race condition and, therefore, can operate with stability and precision.

SUMMARY OF THE INVENTION

A novel shift register according to the present invention comprises shifting sections each including a CMOS transmission gate, and latching sections each including a series combination of two inverters and a CMOS transmission gate connected in parallel with the series combination of the inverters. The shifting sections and the latching sections are connected in cascade. The latching sections and the shifting sections alternate with each other in the cascaded connection. The phases of the clocks for driving the latching sections and the phases of the clocks for driving the shifting sections are in such a phase relationship that the latching sections are driven earlier than the associated shifting sections. The resistance of the CMOS transmission gate of the shifting sections when it is conductive is larger than that of the CMOS transmission gate of the latching sections.

Now, the present invention is described in detail with reference to the accompanying drawings.

BRIEF DESCRIPTION OF THE DRAWINGS

FIG. 7 shows a shift register according to a second embodiment of the present invention;

FIG. 8 shows waveforms of clocks for driving the shift register shown in FIG. 7; and FIG. 9 illustrates a circuit which may be used to generate the driving clocks shown in FIG. 8.

DETAILED DESCRIPTION OF EMBODIMENTS

Figure 1:
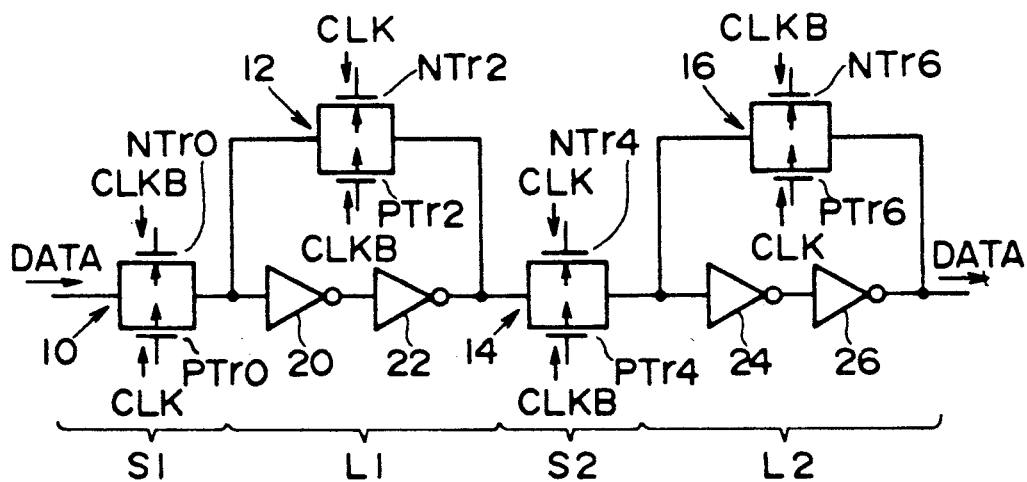
FIG. 1 is a circuit diagram of an example of conventional shift registers.

FIG. 1 shows a basic configuration of a typical example of conventional shift registers which do not use D flip-flops. CMOS transmission gates 10, 12, 14 and 16 each comprises an N-channel MOS transistor NTr and a P-channel MOS transistor PTr which are connected in parallel. Numerals 0, 2, 4 and 6 attached at the end of the respective transistors NTr and PTr indicate that the transistors are of the transmission gates 10, 12, 14 and 16, respectively. For example, NTr0 and PTr0 belong to the CMOS transmission gate 10, and NTr2 and PTr2 belong to the gate 12. Two of inverters 20, 22, 24 and 26 are connected in parallel with an associated one of CMOS transmission gates, as shown in FIG. 1.

The CMOS transmission gates 10 and 14 form shifting sections S1 and S2, respectively. The parallel combination of the CMOS transmission gate 12 and the two inverters 20 and 22 and the parallel combination of the CMOS transmission gate 16 and the inverters 24 and 26 form latching sections L1 and L2, respectively. The shifting sections and the latching sections are connected in cascade and alternate with each other. Two shifting sections (S1, S2) and two latching sections (L1, L2) are for one bit of the shift register. The numbers of shifting sections and latching sections determine the amount of shift. In other words, a shift register which is designed for n-bit shifting operation (where n is a positive integer), includes n×2 shifting sections and n×2 latching sections.

Other than CMOS inverters, circuits, such as NAND gates and NOR gates, which have a function to invert an input applied thereto depending on the type of control signals applied thereto and the manner of applying such control signals, may be used. For example, when a NAND gate is used, input data is applied to one input terminal thereof, and a $\overline{\text{RESET}}$ signal, which is "0" for resetting and "1" during operation, is applied to the other input terminal, whereby the NAND gate exhibits an input inverting function. When a NOR gate is used, input data is applied to one input terminal thereof, and a RESET signal, which is "1" for resetting and "0" during operation, is applied to the other terminal, whereby the NOR gate exhibits an input inverting function.

Figure 2:
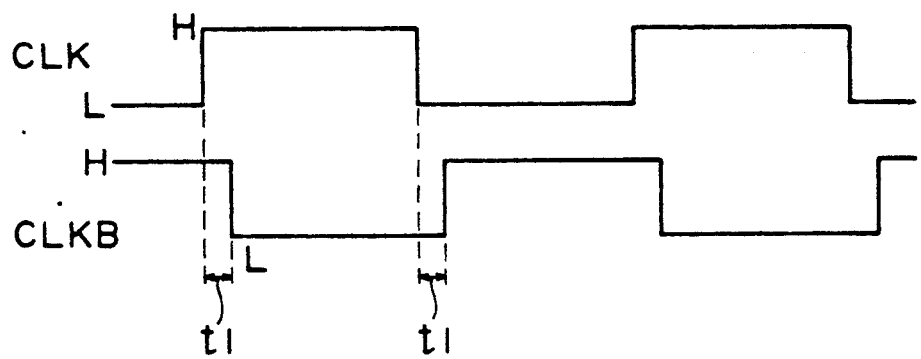
FIG. 2 shows waveforms of driving clocks used in the shift register shown in FIG. 1.

With the above-described arrangement of the shift register, clocks CLK and CLKB shown in FIG. 2, which are in opposite phase with each other, are applied, from a clock generator (not shown) to the associated transmission gates in the manner as shown in FIG. 1. Thus, data held in one latching section is successively shifted to a succeeding latching section, i.e., from the latching section L1 to the latching section L2 in the example illustrated in FIG. 1. An N-channel MOS transistor NTr in each transmission gate transmits L-level data, and a P-channel MOS transistor PTr transmits H-level data.

When the level of the clock CLK is L and the level of the clock CLKB is H, the transmission gates 10 and 16 are in the ON (i.e., conductive) state, while the transmission gates 12 and 14 are in the OFF (non-conductive) state. Then, data is held in the latching section L2, and next data is transmitted through the transmission gate 10 to the inverters 20 and 22 of the latching section L1.

Next, when the level of the clock CLK changes to H and the level of the clock CLKB changes to L, the transmission gates 12 and 14 are placed in the ON state, whereas the transmission gates 10 and 16 are placed in the OFF state. The "next" data which has been transmitted to the inverters 20 and 22 of the latching section L1 is held in the latching section L1, and, at the same time, it is transmitted through the transmission gate 14 to the inverters 24 and 26 of the latching section L2.

Then the clocks CLK and CLKB change respectively to L and H levels, and the "next" data which has been transmitted to the latching section L2 is held in the latching section L2. In this manner, a shifting operation for one bit of the shift register is completed in one period of the clocks CLK and CLKB.

Figure 3:
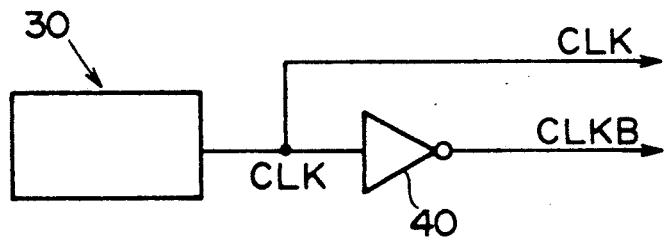
FIG. 3 shows an example of circuits which can generate the clocks shown in FIG. 2.

The clocks CLK and CLKB may be provided by a combination of a clock oscillator 30 and an inverter 40, as shown in FIG. 3. Ideally, the two clocks CLK and CLKB should be exactly in opposite phase with each other, so that the rising edge of one clock is exactly coincident in time with the falling edge of the other. However, in fact, there is a delay in the operation of the inverter 40, which imparts a delay to the clock CLKB. Therefore, an error or phase difference t1 from the ideal opposite phase relationship is introduced, which, in turn, causes both clocks to simultaneously assumes the level H or L for a time period t1.

If the time period during which both clocks are at H is long, all of the transistors NTr0–NTr6 of the transmission gates 10–16 are rendered conductive, so that data of L level is shifted for plural bits at a time. On the other hand, if the time period during which both clocks are at L is long, all of transistors PTr0–PTr6 are rendered conductive, so that data of H level are shifted for plural bits at a time. This phenomenon is called race condition.

As described above, there is a high possibility that a race condition may undesirably occur in the shift register shown in FIG. 1. When a race condition occurs, the operation of the system incorporating the shift register is disturbed and the intended function cannot be achieved.

The present invention provides a shift register in which the phases of the clocks for driving the latching sections are advanced relative to the phases of the clocks which are driving the shifting sections, and the resistance of the transmission gates of the shifting sections when they are conductive (hereinafter referred to as ON-resistance) is larger than that of the transmission gates of the latching sections.

Figure 4:
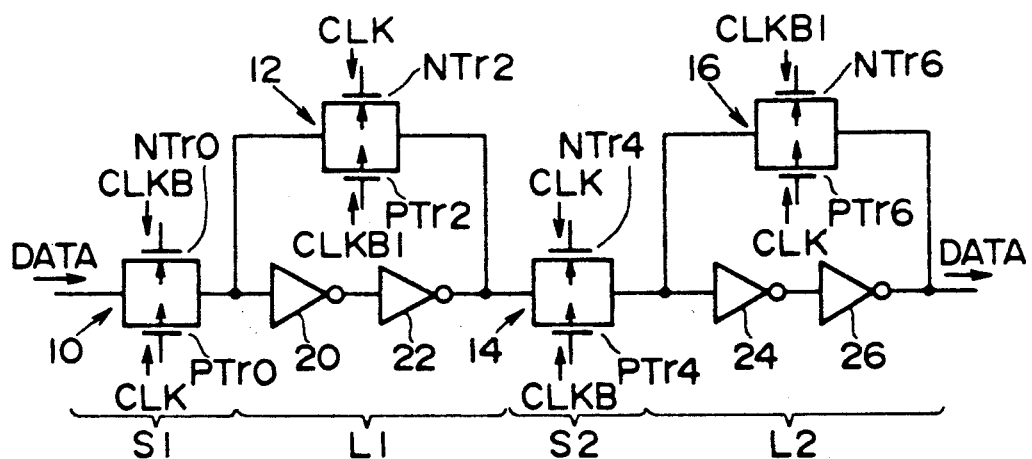
FIG. 4 shows a shift register according to a first embodiment of the present invention.

Referring to the drawings, some embodiments of the present invention are described. In FIG. 4, reference numerals 10, 12, 14 and 16 denote CMOS transmission gates, 20, 22, 24 and 26 denote inverters, S1 and S2 denote shifting sections, L1 and L2 denote latching sections, NTr0, NTr2, NTr4 and NTr6 denote N-channel MOS transistors, and PTr0, PTr2, PTr4 and PTr6 are P-channel MOS transistors. These components are similar to the similarly labeled ones of the conventional shift register shown in FIG. 1.

The basic structure of the shift register of the present invention is similar to that of the conventional one. However, according to the present invention, the resistance during the conductive state (i.e., ON-resistance) of the transmission gates which form the shifting sections S1 and S2 is larger than the ON-resistance of the transmission gates of the latching sections L1 and L2. For example, if the threshold of each of the inverters 20 and 24 is at the midpoint between the H and L levels of data, the ratio of the ON-resistance of the transmission gate 10 to that of the transmission gate 12 is selected to be larger than 1:1, for example, 1.2:1 or larger. The ON-resistance of the transmission gates is determined by the designs of the MOS transistors PTr's and NTr's of the transmission gates.

Figure 5:
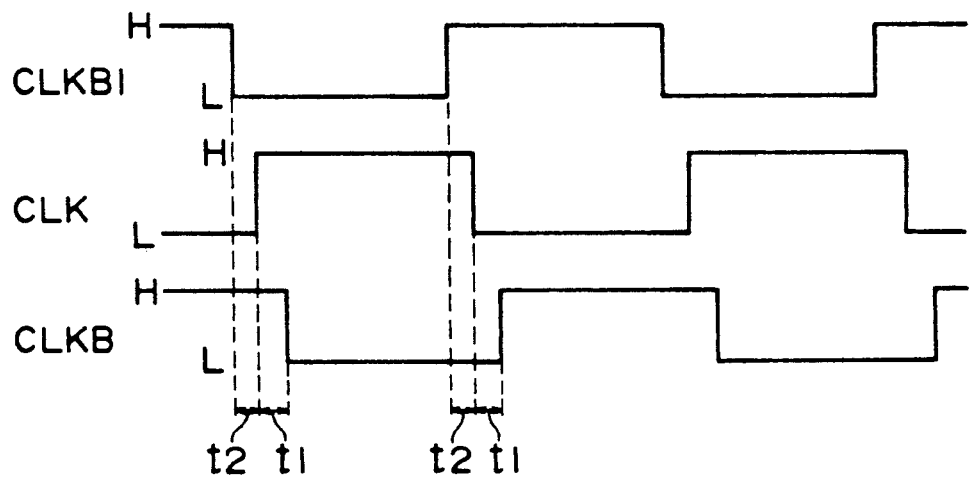
FIG. 5 shows waveforms of clocks for driving the shift register shown in FIG. 4.

According to the present invention, in addition to clocks similar to the clocks CLK and CLKB shown in FIG. 2, another clock CLKB1, which advances in phase from the clocks CLK and CLKB, as shown in FIG. 5, is used. The transmission gates 10 and 14 of the shifting sections S1 and S2, respectively, are driven with the clocks CLK and CLKB, whereas the transmission gates 12 and 16 of the latching sections L1 and L2, respectively, are driven with the clocks CLK and CLKB1.

Figure 6:
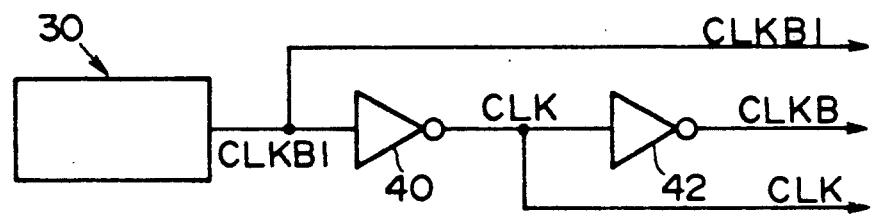
FIG. 6 illustrates a circuit which may be used to generate the driving clocks shown in FIG. 5.

The clocks CLK, CLKB and CLKB1 may be provided by a combination of a clock oscillator 30 and inverters 40 and 42 shown in FIG. 6. Due to the presence of the inverters 40 and 42, the clock CLKB1 advances in phase from the clock CLK by an amount corresponding to t2, and the clock CLKB lags in phase behind the clock CLK by an amount corresponding to t1 (FIG. 5). The clock CLK is applied to the transistors PTr0, NTr2, NTr4 and NTr6. The clock CLKB is applied to the transistors NTr0 and PTr4, and the clock CLKB1 is applied to the transistors PTr2 and NTr6.

Now the operation of the shift register shown in FIG. 4 is described. As in the conventional shift register, one bit is shifted for one period of the clocks CLK and CLKB. Further, as in the conventional shift register, there will be time intervals, t1, during which the levels of the clocks CLK and CLKB are both H or both L, due to delays in the inverters. However, even if the interval during which the levels of the clocks CLK and CLKB are both H becomes long, the transmission gate 12 of the latching section L1 is conductive when the interval t1 is initiated, since the level of the clock CLKB1 becomes L at time t2 before the initiation of the time interval t1.

The shifted data (e.g., the L level) transmitted by the transmission gate 10 and the latched data (e.g., the H level) transmitted through the transmission gate 12 will coexist. However, since the ON-resistance of the transmission gate 12 is smaller than that of the transmission gate 10, priority is given to the latched date (H) according to the resistive voltage division principle, and, therefore, no race condition occurs.

On the other hand, assuming that the time interval during which the levels of both clocks CLK and CLKB are simultaneously L becomes longer, the transmission gate 16 of the latching section L2 has already been conductive, since the clock CLKB1 becomes H a time t2 before the initiation of the time interval t1. Although a data transmitted through the transmission gate 14 of the shifting section S2 (e.g., H level) and data (e.g., L level) transmitted through the transmission gate 16 coexist, priority is given to the data transmitted through the transmission gate 16 because the ON-resistance of the transmission gate 14 of the shifting section S2 is larger than that of the transmission gate 16 of the latching section 12. Thus, no race condition will occur.

FIG. 7 shows a second embodiment of the present invention. In the shift register shown in FIG. 4, the clock CLK is used for driving both the shifting sections and the latching sections. In the embodiment shown in FIG. 7, separate clocks are used for driving the shifting sections and the latching sections.

In FIGS. 7, 8 and 9, the same reference numbers and symbols as the ones used in FIGS. 1 through 6 denote similar components and functions shown in FIGS. 1 through 6.

Specifically, clocks CLK and CLKB shown in FIG. 8 are applied to transmission gates 10 and 14 of shifting sections S1 and S2, while clocks CLK1 and CLKB1 also shown in FIG. 8 are applied to transmission gates 12 and 16 of latching sections L1 and L2. The clock CLKB1 advances in phase by an amount corresponding to a time period t2 from the clock CLK, and the clock CLK1 advances in phase by an amount corresponding to a time period t3 from the clock CLKB1. These clocks may be generated by a combination of a clock oscillator 30 and inverters 44, 46 and 48 shown in FIG. 9. The operation of the shift register of FIG. 7 is substantially the same as that of the shift register shown in FIG. 4, and no race condition occurs in this shift register, either.

As described in detail in the above, according to the present invention, the phases of the clocks used to drive the latching sections of the shift register are advanced from the phases of the clocks used to drive the shifting sections, and the ON-resistance of the transmission gates of the shifting sections is designed to be larger than that of the transmission gates of the latching sections. Accordingly, even when the time period during which the levels of the two clocks driving the shifting sections are both H or both L becomes longer, data in the latching sections are always given priority upon the switching of the transmission gates of the shifting sections and, therefore, no race condition will occur. Furthermore, the present invention has another advantage over a shift register using D flip-flops; because of a small number of constituent components, the shift register of the present invention is easily constructed as an integrated circuit.

It should be noted that the shift registers shown and described with reference to FIGS. 4 and 7 are only embodiments and the present invention is not limited to them. People skilled in the art can modify in various ways the present invention defined by the accompanying claims, and, needless to say, such modifications are also within the scope of the present invention.

What is claimed is:

1. A shift register comprising:
   a cascade connection;
   said cascade connection including a plurality of shifting sections each one of which alternating with ones of a plurality of latching sections;
   each of said shifting sections including a CMOS transmission gate;
   each of said latching sections including a series combination of two inverters;
   each of said latching sections further including a CMOS transmission gate connected in parallel with its respective series combination;
   wherein phases of clocks that drive said shifting and said latching sections are in a relationship such that said latching sections are driven earlier in time than said shifting sections; and
   a resistance of said shifting section CMOS transmission gates during conduction is larger than a resistance of said latching section transmission gates during their conduction such that, in an event that said latching and shifting transmission gates conduct simultaneously, latched data, output by said series combinations of inverters, predominates over shifted data at the inputs of said series combinations of inverters due to the resistive voltage division principle whereby a race condition is prevented.

2. A shift register comprising:
   a cascade connection;
   said cascade connection including a plurality of shifting sections alternating with a plurality of latching sections;
   each of said shifting sections including a CMOS transmission gate;
   each of said latching sections including a series combination of two inverters;
   each of said latching sections including further a CMOS transmission gate connected in parallel with said series combination;
   said respective CMOS transmission gates being driven by a pair of clocks selected from a plurality of clocks;
   said pair of clocks running in substantially mutually opposite phase to one another;
   said pair of clocks being provided by a circuit;
   said circuit including a plurality of inverters;
   wherein the phases of said clocks for driving said CMOS transmission gates of said latching sections advance the phases of said clocks for driving said CMOS transmission gates of said shifting sections; and
   a resistance of said shifting section CMOS transmission gates during their conduction is larger than a resistance of said latching section CMOS transmission gates while said CMOS transmission gates are conducting such that, in an event that said latching and shifting transmission gates conduct simultaneously, latched data, output by said series combinations of inverters, predominates over shifted data at the inputs of said series combinations of inverters due to the resistive voltage division principle whereby a race condition is prevented.

3. A shift register according to claim 1 wherein each of said CMOS transmission gates of said shifting and said latching sections comprises;
   a parallel combination of an N-channel MOS transistor and a P-channel channel MOS transistor; each of said N-channel MOS transistor and said P-channel MOS transistor having respective gate electrodes; and
   each of said respective gate electrodes receiving a different clock for ON-OFF controlling of MOS transistors associated therewith.

4. A shift register according to claim 2 wherein each of said CMOS transmission gates of said shifting and said latching sections includes:
   a parallel combination of an N-channel MOS transistor and a P-channel MOS transistor;
   each of said N-channel MOS transistor and said P-channel MOS transistor having respective gate electrodes; and
   each of said respective gate electrodes receiving a different clock for ON-OFF controlling of MOS transistors associated therewith.

5. A shift register according to claim 1 wherein each of said CMOS transmission gates of said shifting and said latching sections comprises:
   a parallel combination of an N-channel MOS transistor and a P-channel MOS transistor;
   each of said N-channel MOS transistor and said P-channel MOS transistor having respective gate electrodes;
   wherein said CMOS transmission gates are driven by pairs of clocks selected from a first clock, a second clock and a third clock with said pairs of clocks being in substantially mutually opposite phase;
   said first clock having a first phase;
   said second clock being substantially in opposite phase with said first clock;
   said second clock having an inherent phase delay so that said second clock cannot be in exact opposite phase with said first clock;
   said third clock being substantially in opposite phase with said first clock and being advanced in phase from said first clock;
   said P-channel MOS transistors and said N-channel MOS transistors of said CMOS transmission gates of alternate ones of said shifting sections in said cascade connection receive said first clock and said second clock, respectively;
   said P-channel MOS transistors and said N-channel MOS transistors of said CMOS transmission gates of other ones of said shifting sections in said cascade connection receive said second clock and said first clock, respectively;
   said P-channel MOS transistors and said N-channel MOS transistors of said CMOS transmission gates of alternate ones of said latching sections in said cascade connection receive said third clock and said first clock, respectively; and
   said P-channel MOS transistors and said N-channel MOS transistors of said CMOS transmission gates of other ones of said latching sections in said cascade connection receive said first clock and said third clock, respectively.

6. A shift register according to claim 1 wherein each of said CMOS transmission gates of said shifting and said latching sections comprises:
   a parallel combination of an N-channel MOS transistor and a P-channel MOS transistor;
   each of said N-channel MOS transistor and said P-channel MOS transistor having respective gate electrodes;
   said CMOS transmission gates are driven by pairs of clocks selected from a first clock, a second clock, a third clock and a fourth clock, with said pairs of clocks being substantially mutually opposite in phase;
   said first clock having a first phase;
   said second clock being substantially in opposite phase with said first clock;
   said second clock having an inherent phase delay so that said second clock cannot be in exact opposite phase with said first clock;
   said third clock being substantially in opposite phase with said first clock and is advanced in phase from said first clock;
   said fourth clock being substantially in opposite phase with but advanced in phase from said third clock;
   said P-channel MOS transistors and said N-channel MOS transistors of said CMOS transmission gates of alternate ones of said shifting sections in said cascade connection receive said first clock and said second clock, respectively;
   said P-channel MOS transistors and said N-channel MOS transistors of said CMOS transmission gates of other ones of said shifting sections in said cascade connection receive said second clock and said first clock, respectively;
   said P-channel MOS transistors and said N-channel MOS transistors of said CMOS transmission gates of alternate ones of said latching sections in said cascade connection receive said third clock and said fourth clock, respectively; and
   said P-channel MOS transistors and said N-channel MOS transistors of said CMOS transmission gates of other ones of said latching sections in said cascade connection receive said fourth clock and said third clock, respectively.

7. A shift register according to claim 2 wherein each of said CMOS transmission gates of said shifting and said latching sections comprises:
   a parallel combination of an N-channel MOS transistor and a P-channel MOS transistor;
   each of said N-channel MOS transistor and said P-channel MOS transistor having respective gate electrodes;
   wherein said CMOS transmission gates are driven by pairs of clocks selected from a first clock, a second clock and a third clock, with said pairs of clocks being substantially mutually opposite in phase;
   said first clock having a first phase;
   said second clock being substantially in opposite phase with said first clock;
   said second clock having an inherent phase delay so that said second clock cannot be in exact opposite phase with said first clock;
   said third clock being substantially in opposite phase with said first clock and being advanced in phase from said first clock;

said P-channel MOS transistors and said N-channel MOS transistors of said CMOS transmission gates of alternate ones of said shifting sections in said cascade connection receive said first clock and said second clock, respectively;

said P-channel MOS transistors and said N-channel MOS transistors of said CMOS transmission gates of other ones of said shifting sections in said cascade connection receive said second clock and said first clock, respectively;

said P-channel MOS transistors and said N-channel MOS transistors of said CMOS transmission gates of alternate ones of said latching sections in said cascade connection receive said third clock and said first clock, respectively; and said P-channel MOS transistors and said N-channel MOS transistors of said CMOS transmission gates of other ones of said latching sections in said cascade connection receive said first clock and said third clock, respectively.

8. A shift register according to claim 2 wherein each of said CMOS transmission gates of said shifting and said latching sections comprises:

a parallel combination of an N-channel MOS transistor and a P-channel MOS transistor;

each of said N-channel MOS transistor and said P-channel MOS transistor having respective gate electrodes;

wherein said CMOS transmission gates are driven by pairs of clocks selected from a first clock, a second clock, a third clock and a fourth clock, with said pairs of clocks being substantially mutually opposite in phase;

said first clock having a first phase;

said second clock being substantially in opposite phase with said first clock;

said second clock having an inherent phase delay so that said second clock cannot be in exact opposite phase with first clock;

said third clock being substantially in opposite phase with said first clock and being advanced in phase from said first clock;

said fourth clock being substantially in opposite phase with but advanced in phase from said third clock;

said P-channel MOS transistors and said N-channel MOS transistors of said CMOS transmission gates of alternate ones of said shifting sections in said cascade connection receive said first clock and said second clock, respectively;

said P-channel MOS transistors and said N-channel MOS transistors of said CMOS transmission gates of other ones of said shifting sections in said cascade connection receive said second clock and said first clock, respectively;

said P-channel MOS transistors and said N-channel MOS transistors of said CMOS transmission gates of alternate ones of said latching sections in said cascade connection receive said third clock and said fourth clock, respectively; and said P-channel MOS transistors and said N-channel MOS transistors of said CMOS transmission gates of other ones of said latching sections in said cascade connection receive said fourth clock and said third clock, respectively.

9. A shift register for shifting one bit of data from an input to an output thereof, comprising:

a first shifting section for receiving said one bit of input data;

said first shifting section including a first transmission gate for transferring data to an output of said first shifting section;

a first latching section for latching said one bit of input data from the output of said first shifting section;

said first section including a second transmission gate for latching by transferring an output to an input, each being of said first latching section;

said second transmission gate having a lower ON-resistance than said first transmission gate, whereby preference is given to latching over shifting, due to a resistive voltage division principle, in an event that said first and second transmission gates conduct simultaneously;

a second shifting section for shifting said one bit of input data latched in said first latching section;

said second shifting section including a third transmission gate for transferring data to an output of said second shifting section;

a second latching section for latching said one bit of input data from said second shifting section from the output of said second shifting section;

said second latching section including a fourth transmission gate for latching by transferring an output to an input, each being of said second latching section; and said fourth transmission gate having a lower ON-resistance than said third transmission gate, whereby preference is given to latching over shifting, due to the resistive voltage division principle, in an event that said third and fourth transmission gates conduct simultaneously.

10. Apparatus according to claim 9, further comprising:

clock means for controlling switching of said second transmission gate before said first transmission gate, and for controlling switching of said fourth transmission gate before said third transmission gate.

11. Apparatus according to claim 10, wherein said clock means for controlling includes:

a first clock, a second clock and a third clock;

said second clock lagging said first clock;

said third clock lagging said second clock; and said first and second means for controlling employing said second and third clocks for controlling said first and third transmission gates and employing said first and second clocks for controlling said second and fourth transmission gates.

12. Apparatus according to claim 10, wherein said clock means for controlling includes:

a first clock a second clock, a third clock and a fourth clock;

said second clock lagging said first clock;

said third clock lagging said second clock;

said fourth clock lagging said third clock; and said clock means for controlling employing said third and fourth clocks for controlling said first and second shifting sections and employing said first and second clocks for controlling said first and second latching sections.

* * * * *